United States Patent
Meeuwsen et al.

(10) Patent No.: US 6,597,044 B2
(45) Date of Patent: Jul. 22, 2003

(54) SEMICONDUCTOR DEVICE HAVING A CHARGE REMOVAL FACILITY FOR MINORITY CARRIERS

(76) Inventors: Constantinus Paulus Meeuwsen, Gerstweg 2, 6534 AE Nijmegen (NL); Adrianus Willem Ludikhuize, Prof. Holstlaan 6, 5656 AA Eindhoven (NL)

( * ) Notice: Subject to any disclaimer, the term of this patent is extended or adjusted under 35 U.S.C. 154(b) by 0 days.

(21) Appl. No.: 10/225,500

(22) Filed: Aug. 21, 2002

(65) Prior Publication Data

US 2003/0001217 A1 Jan. 2, 2003

Related U.S. Application Data

(63) Continuation of application No. 09/739,505, filed on Dec. 18, 2000.

(30) Foreign Application Priority Data

Dec. 20, 1999 (EP) .............................................. 99204405

(51) Int. Cl.⁷ ............................................. H01L 31/113
(52) U.S. Cl. ....................... 257/409; 257/408; 257/401; 438/284; 438/286; 438/454
(58) Field of Search ......................... 257/345, 382–409, 257/492, 493; 438/275–291, 452, 298, 450, 299, 128–130, 217, 152, 225, 439, 297

(56) References Cited

U.S. PATENT DOCUMENTS

| 4,868,620 A | | 9/1989 | Kohl et al. ............... 357/73.12 |
| 5,266,509 A | * | 11/1993 | Chen .......................... 438/261 |
| 5,883,413 A | * | 3/1999 | Ludikhuize .................. 257/343 |
| 5,910,670 A | * | 6/1999 | Ludikhuize .................. 257/343 |
| 5,998,845 A | * | 12/1999 | Ludikhuize .................. 257/401 |

* cited by examiner

*Primary Examiner*—David Nelms
*Assistant Examiner*—Long Tran
(74) *Attorney, Agent, or Firm*—Aaron Waxler

(57) ABSTRACT

The invention relates to a high-voltage deep depletion transistor, provided in a semiconductor body (1) having a substrate (2) of a first conductivity type, for example the p-type, and a surface layer (3) of the opposite conductivity type, for example the n-type for an n-channel transistor. To prevent formation of inversion layers below the gate, the channel is subdivided into a plurality of sub-channel regions (7a, 7b, 7c, 7d) mutually separated by p-type regions (11a, 11b, 11c, 11d) which serve to remove generated holes. The p-type regions extend across the whole thickness of the channel and are contacted via the substrate. Each sub-channel region may be subdivided further by intermediate p-type regions (13) to improve the removal of holes.

2 Claims, 2 Drawing Sheets

SEMICONDUCTOR DEVICE HAVING A CHARGE REMOVAL FACILITY FOR MINORITY CARRIERS

CROSS REFERENCE TO RELATED APPLICATIONS

This is a continuation of application Ser. No. 09/739,505 filed Dec. 18, 2000.

BACKGROUND OF THE INVENTION

The invention relates to a semiconductor device with a MOS transistor of the depletion type comprising a semiconductor body with a substrate of a first conductivity type provided with a layer of the opposed, the second conductivity type adjoining a surface of said semiconductor body, in which layer a source zone of the second conductivity type, a drain zone of the second conductivity type, and an interposed channel region of the second conductivity type are defined, while a gate electrode is provided above the channel region, electrically insulated therefrom by an insulating layer, and the semiconductor body is further provided with a zone of the first conductivity type which forms a pn junction with the channel region and which adjoins the surface for the removal of minority charge carriers from the channel region. Such a device is known inter alia from the patent document U.S. Pat. No. 4,868,620.

Such transistors, often referred to as deep depletion MOST, may be used to advantage in high-voltage circuits, for example for deriving a lower voltage from the high supply voltage while connected as a source follower, which lower voltage may be used as a supply voltage for a low-voltage portion which is often present in an integrated high-voltage circuit.

In the semiconductor device known from the U.S. patent cited above, the semiconductor layer adjoining the surface is formed by an n-type epitaxial silicon layer provided on a p-type silicon substrate. An island is defined in the epitaxial layer by deep p-type insulation zones, in which island the source and drain are formed as strongly doped n-type zones, separated from one another by an n-type channel region with a lower doping level and an adjoining drift region. A gate electrode, separated from the channel by an oxide layer, is provided above the channel layer.

The current between source and drain in such a transistor is controlled by means of a depletion region which is induced in the channel by the voltage at the gate. At higher voltages, the operation may be hampered by the generation of minority charge carriers (holes in the case of an n-channel transistor), which form an inversion layer below the gate and screen off the latter from the channel, so that it is no longer possible inter alia to bring the transistor into the pinch state. To prevent an inversion occurring below the gate, the patent document U.S. Pat. No. 4,868,620 proposes the provision of a discharge for minority charge carriers in the form of a p-type surface zone. A suitable low voltage is applied to this zone via an electrical connection such that holes are removed across the blocked pn junction. To prevent punch-through between this discharge zone and the subjacent p-type substrate, a strongly doped n-type buried layer is provided below the zone between the epitaxial layer and the substrate, screening off the substrate from the epitaxial layer locally.

The zone forming a discharge for minority charge carriers in this known transistor is provided in the current path between source and drain and accordingly influences various electrical properties of the transistor to a non-negligible degree, for example its resistance, which is undesirable from a viewpoint of design technology. In addition, the construction of the transistor requires the availability of an epitaxial layer because of the presence of a buried layer, which means that it is not or hardly possible to provide the semiconductor layer, for example, in the form of an implanted layer.

BRIEF SUMMARY OF THE INVENTION

The invention has for its object inter alia to provide a semiconductor device of the kind described in the opening paragraph in which the transistor is provided with a charge removal facility for minority carriers which is not situated in the current path between source and drain. The invention further has for its object to provide a transistor with a construction which allows of a higher flexibility in the manufacturing process than does the known transistor.

According to the invention, a semiconductor device of the kind mentioned in the opening paragraph is for this purpose characterized in that the channel region comprises two or more sub-regions which are mutually separated by said surface zone of the first conductivity type, which surface zone extends from the surface transversely across the thickness of the layer of the second conductivity type up to the substrate of the first conductivity type. The current path between source and drain in this device does not run below the removal facility for minority charge carriers, but instead next to this zone or between two zones in the case of several discharge zones distributed over the width of the channel, so that the resistance of the channel is substantially defined by the channel width. Since the removal zone for minority charge carriers is connected to the substrate of the same conductivity type, it is not necessary to provide the removal zone with a connection to the surface of the semiconductor body, but the minority charge carriers can be discharged via the substrate. In addition, it is not necessary to form a buried screening zone between the removal zone for minority charge carriers and the substrate, so that the semiconductor layer may be formed not only by epitaxy but also by means of ion implantation.

An embodiment which has the advantage that the pinch voltage is defined by the vertical depletion region induced by the insulated gate and not by the lateral depletion region induced by the surface zone is characterized in that the sub-regions of the channel region have a width which is greater than the thickness of the channel region and in comparison with said thickness is so great that the transistor is pinched by the depletion region induced by the gate.

Although alternative designs may also be used to advantage, special advantages are obtained in embodiments wherein a subdivided channel region and a subdivided surface zone of the first conductivity type in conjunction form a closed structure around the drain (or the source), as seen at the surface, while the source (or the drain) zone is situated outside this closed structure. A preferred embodiment of such a device is characterized in that the channel region, seen in plan view, has the shape of a polygon in which that portion of the semiconductor layer which is enclosed by the polygon comprises the drain and that portion of the semiconductor layer which is situated outside the polygon comprises the source, while a number of surface zones of the first conductivity type are present for the removal of minority charge carriers, which surface zones are present at the corners of the polygon, and the sub-regions of the channel region are situated at the lateral sides of the polygon. Preferably, the polygon is formed by a regular polygon, for example a square. A further embodiment is characterized in that the lateral sides of the polygon are each provided with at least one further surface zone of the first conductivity type which extends transversely across the thickness of the semiconductor layer for the purpose of removal of minority charge carriers.

BRIEF DESCRIPTION OF THE DRAWINGS

These and other aspects of the invention will be explained in more detail below with reference to an embodiment. In the drawing.

Figure 1:
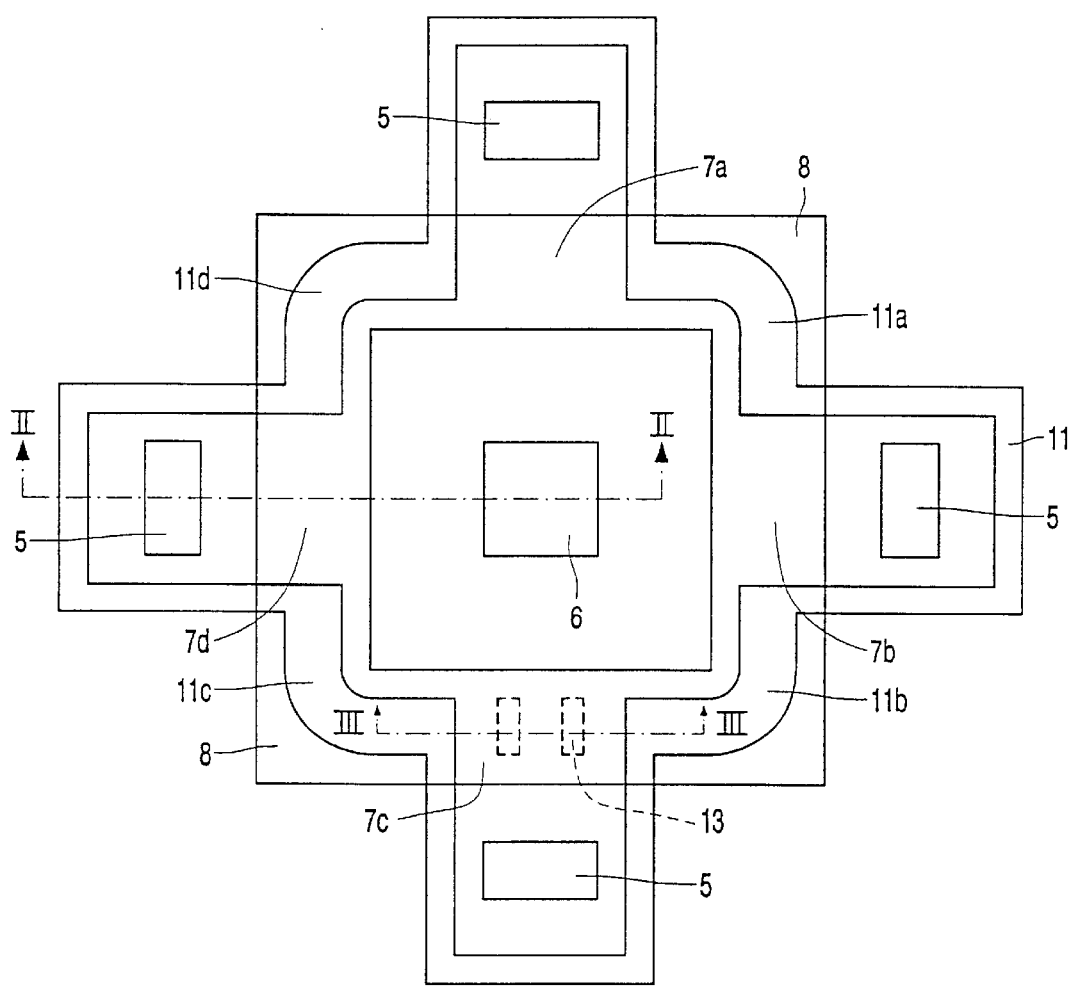
FIG. 1 is a plan view of a semiconductor device according to the invention.

It is noted that the drawing is diagrammatic only and not true to scale. It is also noted that the drawing only shows an MOS transistor, but it will be obvious without further explanation that a large number of other circuit elements may be provided in the same semiconductor body in addition to the transistor shown here, which elements are not shown in the drawing and are not discussed in any detail further below because they have a construction which is usual and known per se.

DETAILED DESCRIPTION OF THE INVENTION

Figure 2:
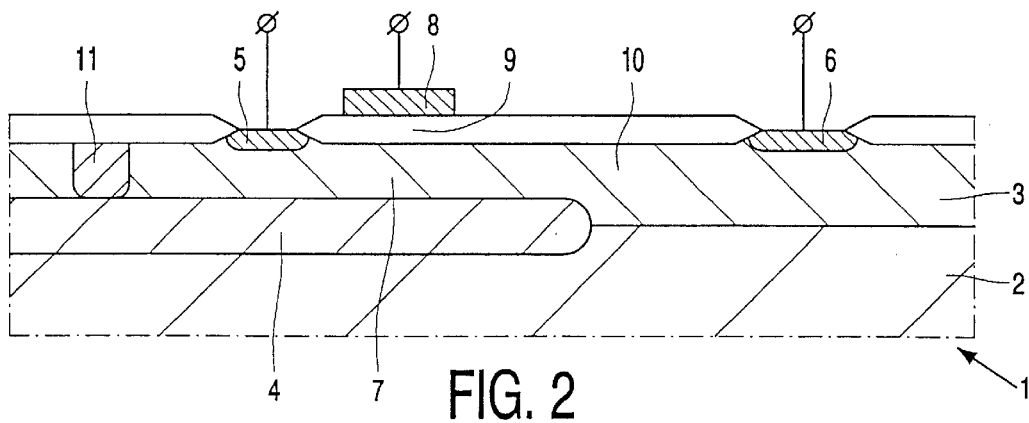
FIG. 2 is a cross-sectional view of this device taken on the line II—II in FIG. 1.
Figure 3:
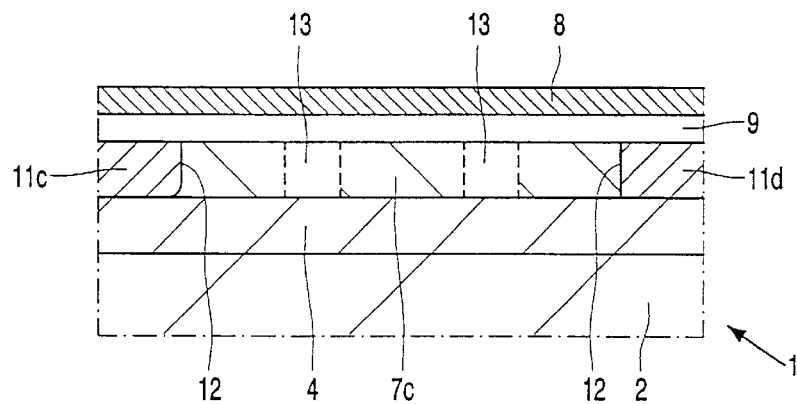
FIG. 3 is a cross-sectional view of this device taken on the line III—III in FIG. 1.

The device comprises a semiconductor body 1 which is made of silicon in the present example but which may obviously also be made of some other suitable semiconductor material. The body 1 comprises a substrate 2 of a first conductivity type, in this example the p-type, with a resistivity of, for example, 100 Ω.cm. An n-type epitaxial silicon layer 3 with a thickness of, for example 10 μm and a doping of $1.5 \times 10^{15}$ atoms per cm$^3$ is provided on the substrate. Instead of this epitaxial layer, an epitaxial layer having a lower doping level may be used, in which the doping is locally enhanced by means of an n-well implantation. A buried layer 4 of the p-type is provided between the epitaxial layer 3 and the substrate 2. This layer is not always necessary, but it offers advantages at very high voltages because the presence of the buried layer 4 leads to a better distribution of the electric field, which is favorable for the breakdown voltage of the transistor. The transistor comprises a source and a drain which are formed by strongly doped n-type surface zones 5 and 6 provided in the epitaxial layer. The zones 5 and 6 are provided with contacts in a usual manner, which contacts are depicted diagrammatically only in FIG. 2. A channel region 7 formed by a portion of the epitaxial layer 3 lies between the source and the drain. The conduction through the channel 7 is controlled by (apart from the substrate voltage) the voltage applied to the gate electrode 8, said gate voltage inducing a depletion region in the channel 7 whereby the channel can be fully pinched. Such a transistor is often referred to as "deep depletion transistor" in the literature. The gate 8 is electrically insulated from the channel region 7 by a gate dielectric 9 which in this example is formed by a layer of silicon oxide with a thickness of approximately 0.8 μm. A drift region 10 lies between the drain 6 and the channel 7 and is formed by a portion of the epitaxial layer 3. The length of the drift region is determined by the maximum voltage applied to the drain 6. In a specific embodiment in which this voltage was 700 V, the length of the drift region was approximately 70 μm. When such a high voltage is applied, with a comparatively low voltage at gate 8, it is possible that an inversion layer of holes is formed below the gate at the boundary between the channel 7 and the oxide layer 9, in the location having the lowest potential. This inversion layer may prevent the channel below the gate from being pinched, and may thus prevent a correct functioning of the transistor. The formation of the inversion layer can be prevented in that a p-type zone 11 adjoining the surface of the semiconductor body is provided in the n-type epitaxial layer 3, as proposed in the cited U.S. patent U.S. Pat. No. 4,868,620, and, according to the invention, which forms a pn junction 12 next to the channel region 7, see FIG. 3. The application of a reverse bias voltage across the pn junction 12 causes the holes generated in or adjacent the channel region to be removed. According to the invention, the channel region 7 comprises a number of sub-regions, referenced 7a, 7b, 7c, and 7d in FIG. 1, which are mutually separated by interposed regions of said p-type surface zone 11. The sub-zones of the surface zone 11 are referenced 11a, 11b, 11c, and 1 id in that order in FIG. 1. The zones 1a, 1b, 11c, and lid extend transversely across the thickness up to the p-type substrate and thus at the same time insulate the sub-channels 7a, 7b, 7c, and 7d from portions of the epitaxial layer situated outside the transistor. Since the sub-zones 11a, 11b, etc. are conductively connected to the substrate 2, it is not necessary to provide these zones with separate contacts. During operation, the holes can be removed through the sub-zones 11a, 11b, etc. and through the substrate 2, where usually the lowest voltage is applied. The width of each sub-channel 7a, 7b, etc. is preferably chosen such that a laterally directed electric field is present across the entire or at least substantially the entire width of the sub-channels below the gate, which field drives the holes to the zones 11. At the doping concentration chosen for the epitaxial layer 3, it is found to be advantageous to choose the widths of the sub-channels 7a, 7b, etc. to be not greater than approximately 50 μm. Great widths are possible with the use of additional sub-zones 13 which may be provided in the sub-channels 7a, 7b, etc. Such zones 13 are shown in FIG. 1 and FIG. 3 with broken lines for illustration (only in sub-channel 7c to keep the drawing simple, but they should obviously also be provided in the other sub-channels having the same width as channel 7c). The zones 13 also extend transversely across the thickness of the layer 3 up to the substrate 2.

Since the transistor channel is composed of a number of sub-channels which are laterally bounded by hole-removal zones, the current from the source to the drain is conducted not below but between said zones, so that transistor parameters such as the resistance or the pinch voltage are not or only to a minor degree influenced by the presence of the hole-removal zones. The transistor is for this purpose constructed in a special layout of polygonal shape, in this example a regular quadrangle, defined by the p-type zones 11a, 11b, etc. The drain 6 is situated in the central portion of the epitaxial layer 3 surrounded by the quadrangle. The source is situated outside the quadrangle. The p-type zones 11 are situated at the corner points of the quadrangle, the sub-regions 7a, 7b, 7c, and 7d lie on the lateral sides of the quadrangle. The zones 11 also extend around the source zones 5 so as to insulate the source 5 electrically from the rest of the circuit, thus defining an electrically insulated island within which the entire transistor is situated.

Figure 4:
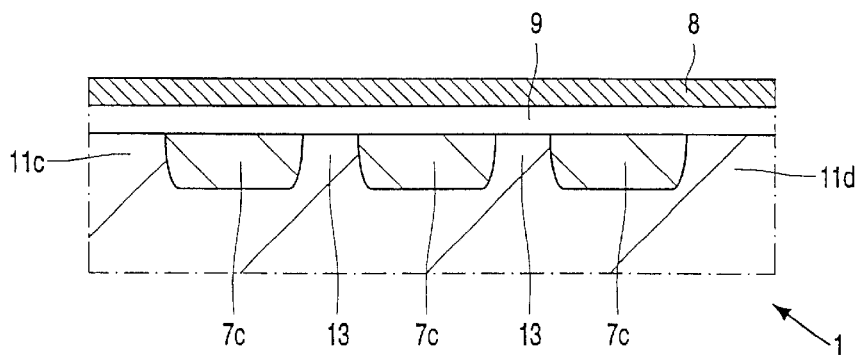
FIG. 4 is a cross-sectional view of a further embodiment of a semiconductor device according to the invention.

In the example described here, the layer 3 is formed by an epitaxial layer, which renders it possible to provide a buried layer 4 locally between the epitaxial layer 3 and the substrate 2. This layer has the same conductivity type as the substrate 2, but a higher doping level. The breakdown voltage of the transistor can be increased by means of the layer 4, as is known, owing to a better distribution of the potential lines. The transistor may be manufactured by methods other than epitaxy, as illustrated in FIG. 4, in those cases in which such a buried layer is not necessary. This Figure shows a modification of the device of the first embodiment in a cross-section corresponding to the cross-section shown in FIG. 3. The layout of the transistor of FIG. 4 is presumed to be identical to that of FIG. 1. The embodiment of FIG. 4 differs from the preceding embodiment mainly in that the semiconductor body is almost entirely of the p-type, and the n-type layer in which the source, the drain, the channel region, and the drift region are formed is obtained through masked implantation of, for example, phosphorus or arsenic ions. FIG. 4 shows the sub-channel 7c which in its turn is subdivided into three sub-regions which are mutually separated by the hole-removal p-type regions 13. The regions 13 are formed by portions of the p-type semiconductor body which were not redoped during the n-implantation or by an additional p-type implantation, as are the p-type regions 11c and 11d which laterally bound the sub-channel 7c.

It will be obvious that the invention is not limited to the examples given here but that many more variations are possible to those skilled in the art within the scope of the invention. Thus, for example, designs other than qudrangles or other regular polygons may be used for the transistor. It is possible, for example, to build up the transistor from a number of parallel sub-channels which are separated from one another by p-type zones for the removal of the holes. Alternatively, sub-channels may be provided, for example, at the corner points of the polygon. The invention may be applied to p-channel transistors instead of n-channel transistors, in which case the channel is formed by a p-type region, the minority charge carriers are electrons, and the electron-removal zones are n-type zones.

What is claimed is:

1. A semiconductor device with a MOS transistor of the depletion type comprising a semiconductor body with a substrate of a first conductivity type provided with a layer of the opposed, the second conductivity type adjoining a surface of said semiconductor body, in which layer a source zone of the second conductivity type, a drain zone of the second conductivity type, and an interposed channel region of the second conductivity type are defined, while a gate electrode is provided above the channel region, electrically insulated therefrom by an insulating layer, and the semiconductor body is further provided with a surface zone of the first conductivity type which forms a pn junction with the channel region and which adjoins the surface for the removal of minority charge carriers from the channel region, characterized in that the channel region comprises two or more sub-regions which are mutually separated by said surface zone of the first conductivity type, which surface zone extends from the surface transversely across the thickness of the layer of the second conductivity type up to the substrate of the first conductivity type.

2. A semiconductor device as claimed in claim 1, characterized in that the sub-regions of the channel region have a width which is greater than the thickness of the channel region and in comparison with said thickness is so great that the transistor is pinched by the depletion region induced by the gate.

* * * * *